United States Patent [19]

Sculley et al.

[11] Patent Number: 6,054,874
[45] Date of Patent: Apr. 25, 2000

[54] OUTPUT DRIVER CIRCUIT WITH SWITCHED CURRENT SOURCE

[75] Inventors: Sua-Ki Stephanie Sculley; Bertrand Jeffery Williams, both of Austin, Tex.

[73] Assignee: Cypress Semiconductor Corp., San Jose, Calif.

[21] Appl. No.: 08/886,914

[22] Filed: Jul. 2, 1997

[51] Int. Cl.[7] .................. H03K 19/0175; H03K 19/094
[52] U.S. Cl. ................................. 326/83; 326/86; 326/73
[58] Field of Search .................................. 326/83, 86, 90, 326/73, 81

[56] References Cited

U.S. PATENT DOCUMENTS 4,163,909  8/1979  Harr .
4,185,211  1/1980  Kucharewski .

(List continued on next page.)

FOREIGN PATENT DOCUMENTS 0 438 706 A2  7/1991  European Pat. Off. .
0 440 192 A1  8/1991  European Pat. Off. .

OTHER PUBLICATIONS

Taniguchi et al., "Current Sources for Emitter–Coupled Logic Circuits and Their Application to Subnanosecond Logic Integrated Circuits," Electronics and Communications in Japan, vol. 60–C, No. 12, 1977, pp. 118–127.

Sidiropoulos et al., "A Speed, Power, and Supply Noise Evaluation of ECL Driver Circuits," 1994 Bipolar/BICMOS Circuits & Technology Meeting, pp. 119–122.

Zargari et al., "A BiCMOS Active Pull–Down ECL Output Driver for Low Power Applications," Jun. 1995 IEEE, pp. 50–51.

Truong et al., "A 531 Mb/s Fibre Channel SIPO/PISO Chip Set Capable of Driving 50 m of Shielded Twisted Pair," May 1993 IEEE, pp. 370–373.

Ueda et al., "A Fully Compensated Active Pull–Down ECL Circuit with Self–Adjusting Driving Capability," IEEE Journal of Solid–State Circuits, vol. 31, No. 1, Jan. 1996, pp. 46–53.

(List continued on next page.)

*Primary Examiner*—Michael Tokar
*Assistant Examiner*—Daniel D. Chang
*Attorney, Agent, or Firm*—Kevin L. Daffer; Conley, Rose & Tayon

[57] ABSTRACT

A driver circuit is presented for producing particular output voltage levels at high speeds using a current switching technique. The circuit employs driver transistors connected in series between switchable current sources. The driver transistors switch current within the current sources through a resistor coupled between an output of the driver circuit and a reference terminal voltage. Switching the current occurs in rapid fashion within an opened loop arrangement. The switchable current sources are configured so that current is present through the current sources whenever a corresponding driver transistor is turned on. Current through the current sources, as switched through the resistor separating the reference terminal voltage and the driver output, is regulated by a closed loop replica circuit. The replica circuit may include an opamp whose output operably produces the regulated current via feedback from the current path to an input of the opamp. Output from the driver circuit may include differential output levels. Those levels are preferably controlled by regulating the current sources providing current to the driver transistors, and using a replica circuit to duplicate the driver transistors from current sources. The replica circuit may therefore be two replica circuits in scaled form. Feedback from a node within a replica circuit may be used along with a high or low reference signal to control current sources in one or both of the replica circuits and one or both of the current sources feeding the driver transistors. In one embodiment, opamps within the feedback circuits can have differential outputs feeding transistors which differentially control the regulated current which is then replicated through a driver transistor.

22 Claims, 3 Drawing Sheets

U.S. PATENT DOCUMENTS

| | | |
|---|---|---|
| 4,393,353 | 7/1983 | Minagawa . |
| 4,574,202 | 3/1986 | Ogawa . |
| 4,720,643 | 1/1988 | Embree et al. . |
| 4,789,798 | 12/1988 | Lach . |
| 4,947,061 | 8/1990 | Metz et al. ................................. 326/73 |
| 4,980,579 | 12/1990 | McDonald et al. . |
| 4,996,448 | 2/1991 | Abdi . |
| 4,998,028 | 3/1991 | Chappell et al. . |
| 5,038,055 | 8/1991 | Kinoshita . |
| 5,089,721 | 2/1992 | Luich . |
| 5,089,723 | 2/1992 | Davis et al. . |
| 5,122,683 | 6/1992 | Sugoh et al. . |
| 5,280,204 | 1/1994 | Livolsi . |
| 5,324,994 | 6/1994 | Sullivan et al. . |
| 5,331,210 | 7/1994 | McCarroll . |
| 5,343,092 | 8/1994 | Dhong et al. . |
| 5,365,279 | 11/1994 | Harford . |
| 5,376,836 | 12/1994 | Tago . |
| 5,404,053 | 4/1995 | Poma et al. . |
| 5,424,658 | 6/1995 | Sikkink et al. . |
| 5,465,057 | 11/1995 | Takahashi . |
| 5,495,184 | 2/1996 | Des Rosiers et al. . |
| 5,514,988 | 5/1996 | Schrader et al. . |
| 5,535,160 | 7/1996 | Yamaguchi . |
| 5,543,668 | 8/1996 | Fong . |
| 5,546,027 | 8/1996 | Shinozaki et al. . |
| 5,574,634 | 11/1996 | Parlour et al. . |
| 5,578,964 | 11/1996 | Kim et al. . |
| 5,606,270 | 2/1997 | D'Souza et al. ........................... 326/98 |
| 5,614,843 | 3/1997 | Mita et al. ................................. 326/73 |
| 5,631,584 | 5/1997 | Smith . |
| 5,757,209 | 5/1998 | Van Zalinge et al. . |
| 5,847,576 | 12/1998 | Mastrocola et al. ....................... 326/31 |

OTHER PUBLICATIONS

Kosyuk, "A Peak Detector with Input–Signal Negative Feedback," 1991 Scripta Technica, Inc., pp. 139–141.

Chen et al., "A Novel Offset Current Cancellation Technique for Switched–Current Circuits and Systems," 1996 IEEE, pp. 417–420.

Kuratli et al., "Implementation of High Peak–Current IGBT Gate Drive Circuits in VLSI Compatible BiCMOS Technology," IEEE Journal of Solid–State Circuits, vol. 31, No. 7, Jul. 1996, pp. 924–932.

Koli et al., "Temperature Compensated Logarithmic Peak Detector," Analog Integrated Circuits and Signal Processing 1996, pp. 131–140.

Venable, "Testing Power Factor Correction Circuits for Stability," Power Quality, Oct. 1993 Proceedings, pp. 225–235.

Agakhanyan, "High–Speed and Wide–Band Analog Integrated Circuits," 1986 Plenum Publishing Corporation, pp. 71–74.

OUTPUT DRIVER CIRCUIT WITH SWITCHED CURRENT SOURCE

BACKGROUND OF THE INVENTION

1. Field of the Invention

This invention relates to an output driver, and more particularly to a pseudo-ECL output driver circuit with improved speed performance using a closed loop circuit to derive a regulated current and an open loop circuit to rapidly switch a replica of that current through an output of the output circuit driver.

2. Description of the Relevant Art

Emitter-coupled logic ("ECL") circuits are advantageously used in high performance computer equipment in part because of the speed provided by ECL technology. Many conventional processor and memory chips are currently fabricated using complementary metal oxide semiconductor (CMOS) technology mostly due to the relatively low power dissipation and high density afforded by CMOS. In order to combine CMOS and ECL chips in the same system, the CMOS devices may be tailored to provide ECL-level voltage outputs. CMOS circuits that produce outputs at ECL levels may be referred to as pseudo-ECL (or "PECL") circuits.

Integrated circuit devices which have outputs for driving ECL-based chips preferably output precisely controlled voltage levels. This is because the ECL transistors should not be driven to saturation since speed is obtained by operating the transistors in a non-saturated mode. For example, conventional ECL input/output levels may be at (e.g., $V_{DD}$–0.86 volts and $V_{DD}$–1.81 volts) for binary logic levels "1" and "0," respectively. Pseudo-ECL circuits should therefore operate within the close constraints of conventional operating voltage levels (i.e., produce voltage levels that do not vary from the ECL input specification). CMOS circuits are usually driven rail-to-rail (full voltage supply levels) to reduce power dissipation. In pseudo-ECL application, provisions should be made to control the output voltage levels to values less than full rail-to-rail since the intent is to apply the output to the closely held ECL voltage range.

One example of a conventional MOS circuit 10 used to drive ECL-type voltage levels is shown in FIG. 1. Circuit 10 may therefore be considered a pseudo-ECL driver having driver transistors 12 with resistor loads 14. Current through transistors 12a and 12b can be controlled with differential input signals In. A current source 16 can be connected in series between transistors 12 and ground. A source-follower circuit 18 may be used to modulate current through a resistor 20 connected between the driver output Vout and a reference terminal voltage Vterm.

The reference terminal voltage is generally fixed to a pre-defined amount, preferably near the midscale between the logic "1" ECL level and the logic "0" ECL level. For example, if logic ECL levels "1" and "0" are $V_{DD}$–0.86 and $V_{DD}$–1.81, then Vterm is approximately $V_{DD}$–1.335.

Resistor values 20 and the reference terminal Vterm may be applied on a substrate altogether separate from the substrate containing circuit 10 or, in the alternative, can be contained on the same substrate. Regardless of its configuration, it is desired that the reference terminal voltage be substantially fixed at a pre-defined amount so that the ECL voltage levels upon the output node Vout is derived solely from the current passing through resistor 20. Given a relatively constant resistor value for resistor 20, the high and low logic levels of ECL are thereby dependent upon the current through resistor 20. This assumes a relatively controlled current value to ensure proper margins are maintained for the ECL output levels. Unfortunately, close control of current through resistors 20 cannot be easily obtained.

In the example shown in FIG. 1, the output level produced at Vout will change with variations in the fabrication process used to manufacture circuit 10. For example, slight changes in the threshold voltages of transistors 12, or of the transistors within the source follower circuit 18, will cause corresponding changes in the current through resistor 20. Threshold changes may be the result of, for example, ion implant skew, gate oxide degradation, etc. Likewise, changes in the sheet resistivity or resistor length and width will cause a change in the resistance value of resistors 14. This may result in a change in the gate-to-source voltage applied to the source follower thereby varying current through resistor 20.

Circuit 10 suffers from a speed limitation in addition to it experiencing inappropriate variations in output voltage levels from the desired ECL high and low values. Circuit 10 depicts an open loop configuration, whereby a feedback from the output to the input is "open". Absent feedback, open loop circuits generally operate faster than closed loop circuits having feedback. However, the open loop configuration of circuit 10 nonetheless suffers speed limitations due primarily to the gate capacitance of the source follower transistors and secondarily to the drain parasitic capacitance of the driver transistors. Resistors 14 in conjunction with the capacitance on transistors 12 and device 18 establish an internal RC time constant delay between the time in which a transistor 12 switches to a low resistance state and current appears through the respective resistor 20. It is believed that speed performance of circuit 10 is limited by the time it takes current to pass through resistors 14, followed by the time it takes the current through resistors 14 to charge the gate conductor of the source-follower transistor. This two-stage delay severely limits the open loop configuration shown in FIG. 1.

As an effort to eliminate the effective processing variations within a pseudo-ECL driver circuit, many conventional driver circuits employ a closed loop configuration. An example of one conventional closed-loop pseudo-ECL driver circuit 24 is shown in FIG. 2. Circuit 24 is considered a closed loop circuit in that the output voltage modulated by an output of a switching device is forwarded back to the input of that switching device. The switching device can, according to one example, be an operational amplifier ("opamp") 26. Opamp 26 produces an output based on the comparison between voltage levels forwarded to its inverting and non-inverting inputs. One input can be configured to receive a switching input. If the switching inputs are configured as differential inputs then, a pair of circuits 24 and opamps 26 may be required. However, in the single-ended configuration, a single opamp 26 is used to modulate a transistor 28 arranged similar to the source-follower transistor within device 18 of FIG. 1. Depending on the voltage level of switching input signal, current will either be sourced from the reference terminal voltage or sunk into the reference terminal voltage across resistor 30.

The closed-loop arrangement shown in FIG. 2 beneficially feeds back the output voltage from driver circuit 24 to the input of opamp 26. After the input signal has switched, and time thereafter has somewhat elapsed, Vout will settle to the same voltage as the input signal voltage Vol or Voh. Accordingly, the input signal voltage can be considered a reference voltage switched between the ECL high voltage level Voh and the ECL low voltage level Vol. While the feedback approach serves to correct the output voltage level to the appropriate reference voltage high or low values over time, time is nonetheless required in order for the output to settle to the regulated amount. Closed loop circuit 24 yields even slower operating speeds than the open loop circuit 10 of FIG. 1 due primarily to the output settling time being dependent on the closed loop bandwidth of the feedback system.

U.S. Pat. No. 5,089,723 (herein incorporated by reference) describes a pseudo-ECL driver circuit which uses a closed loop arrangement and establishes busses internally for two output levels used in driving the ECL voltage levels. To address the problem of opamp settling time, the feedback path set forth in Patent 723 includes a transistor which is either identical to, or, to conserve power, a scaled down equivalent to the driver transistor coupled to the output node of the pseudo-ECL driver.

Problems which appear prevalent in conventional MOS-based pseudo-ECL driver circuits are (i) their susceptibility to process variations which skew the ECL output level and/or (ii) their relatively slow presentment of that output level. It is therefore desirable to derive a pseudo-ECL driver circuit which can place, with minimal delay, a regulated ECL voltage level at the output of the driver. The desired improvement must deal with consistently offering a regulated, either positive or negative current, through the resistor linking the output terminal and the reference terminal voltage. The current must be regulated to present an ECL upper or lower voltage level, but without suffering any delay in producing the regulated current through the resistor after switching has occurred.

SUMMARY OF THE INVENTION

The problems outlined above are in large part solved by a high speed pseudo-ECL output driver circuit hereof The present driver circuit produces, through feedback, a regulated current. That regulated current is replicated and available to be quickly switched through a driver transistor linked to the driver circuit output. Upon switching, the replicated current is immediately forwarded through the driver transistor and into the load resistor between the reference terminal voltage and the driver circuit output node.

The regulated current is preferably produced within a closed loop circuit. Specifically, the regulated current is derived from a regulated voltage placed across the regulated current source. The regulated voltage is controlled, after settling has elapsed, to be consistent with a reference voltage level applied to the input of the closed loop circuit. Accordingly, the closed loop circuit can comprise an opamp, whereby the regulated voltage is applied through feedback to one input of the opamp, and the reference voltage is applied to the other. The output of the opamp modulates (or activates and deactivates) current through the regulated current source.

The regulated current can be made available through a driver transistor once the driver transistor is switched to a low resistance state. Producing the regulated current, and replicating voltage drops between the closed loop circuit and an open loop circuit ensures availability of a pre-regulated voltage and/or current upon and within the open loop circuit. Any process variations in the open loop circuit are obviated by regulating the current within the closed loop circuit. Moreover, any delays in the open loop circuit are minimized if not substantially eliminated by a current source in lieu of a passive resistor. The current source is therefore immediately responsive to the regulated voltage.

According to one embodiment, the open loop circuit comprises a pair of transistors connected in series between a pair of current sources modulated by the output of the closed loop circuit. Another pair of transistors can be connected in parallel with the first pair between the current sources to present differential switching inputs.

According to one embodiment, the closed loop circuit comprises an opamp whose output controls current within a current source. The current within that current source is fed through a transistor maintained in a low resistance "on" state and also fed through another current source. The latter current source is coupled between a voltage-regulated node and either ground or a positive power supply. The regulated voltage upon that node is replicated upon the driver circuit output as an ECL high (e.g., Voh) or ECL low (e.g., Vol) value depending on which driver transistor is on and the non-feedback input being at a Voh or Vol level.

The output driver circuit is therefore provided for producing a plurality of voltage levels using current switching for high speed operation. The driver circuit may employ pairs of n-channel and p-channel driver transistors placed in series with constant current sources to switch currents with rapidity to output resistors configured between Vout and Vterm, in an open-loop arrangement. The open-loop arrangement is one which does not involve a feedback loop and the delay associated with feedback. A closed loop circuit may be included having a replica circuit or a pair of replica circuits to duplicate, in scaled form, the driver transistors and current sources in the open loop circuit. The output levels may be controlled by the current sources, using feedback from an output of the replica transistors and one or more reference voltages as inputs to one or more opamps within the closed-loop circuit. The replica circuit may therefore be said to embody a closed loop. However, delay within the closed loop does not effect the overall output slew rate since the replica circuit is preferably active and "locked" well before the input levels to the driver circuit transition.

BRIEF DESCRIPTION OF THE DRAWINGS

Other objects and advantages of the invention will become apparent upon reading the following detailed description and upon reference to the accompanying drawings in which:

FIGS. 8a and 8b are circuit schematics of differentially controlled, switchable current sources shown in FIG. 5, according to one embodiment.

Figure 1:
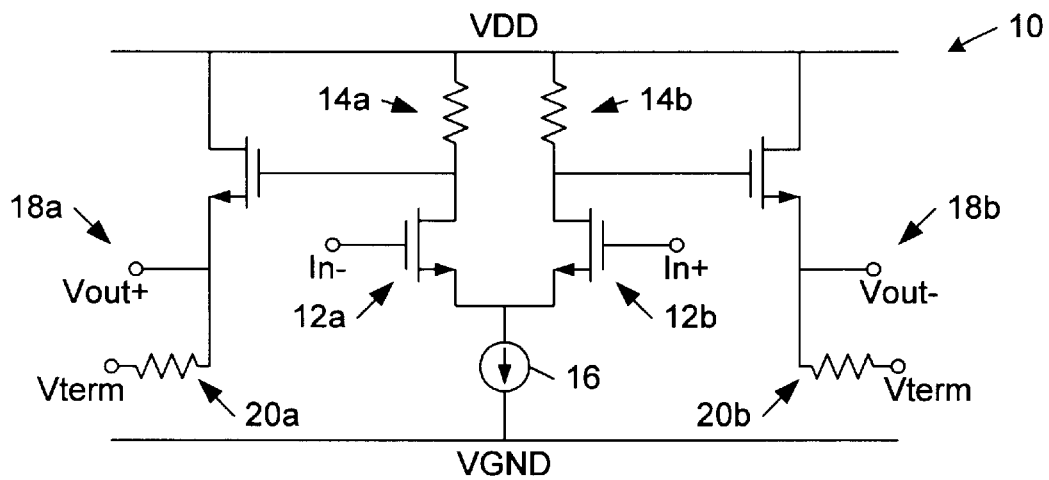
FIG. 1 is an example of a conventional pseudo-ECL driver circuit whose output level is susceptible to fabrication process variations and RC delays.
Figure 2:
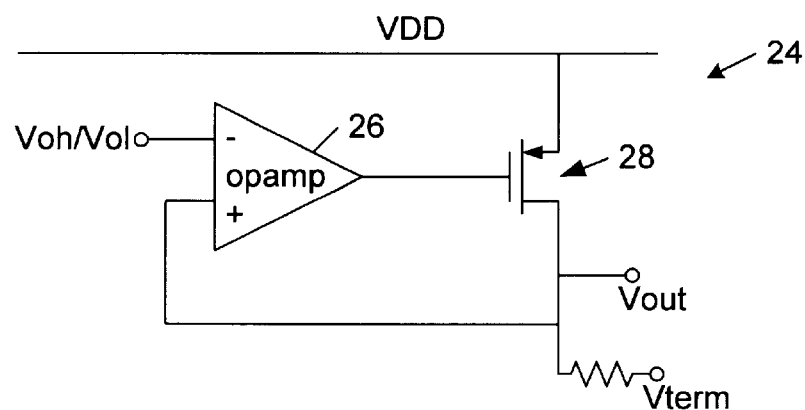
FIG. 2 is an example of a conventional pseudo-ECL driver circuit which, by virtue of a slower operating speed, employs feedback to maintain proper and consistent output levels subsequent to input switching.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
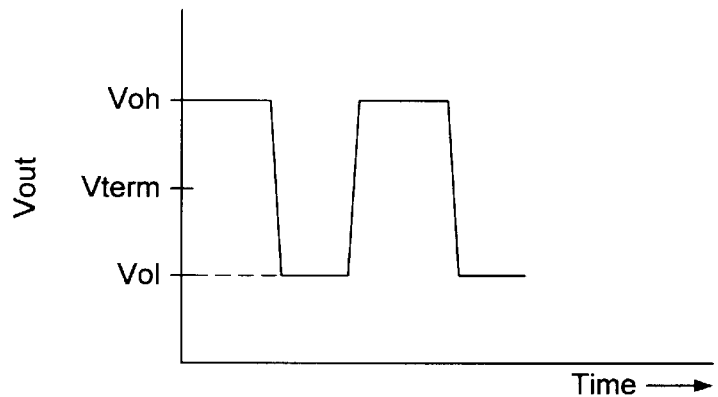
FIG. 3 is a timing diagram of ECL output levels, and the need for rapid settling upon those levels during switch transitions.

Turning now to the drawings, FIG. 3 illustrates a timing diagram of voltage levels output from a pseudo-ECL driver circuit. The output levels switch between a high-ECL level and a low ECL level, shown respectively as Voh and Vol. The ECL levels switch according to whether one of possibly two series-connected driver transistors are off FIG. 3 illustrates one of possibly two driver circuit output levels. If two outputs are used, then the outputs are differential, and operate in reverse of one another. Differential outputs may imply two pairs of series-connected driver transistors. Output from one pair may be labeled Vout+ and output of the other pair may be labeled Vout−. Whether Vout is switched to Voh or Vol is also dependent on whether current is sourced to or sunk from the reference terminal voltage Vterm. Preferably, Vterm is a midscale voltage between Voh and Vol.

Figure 4:
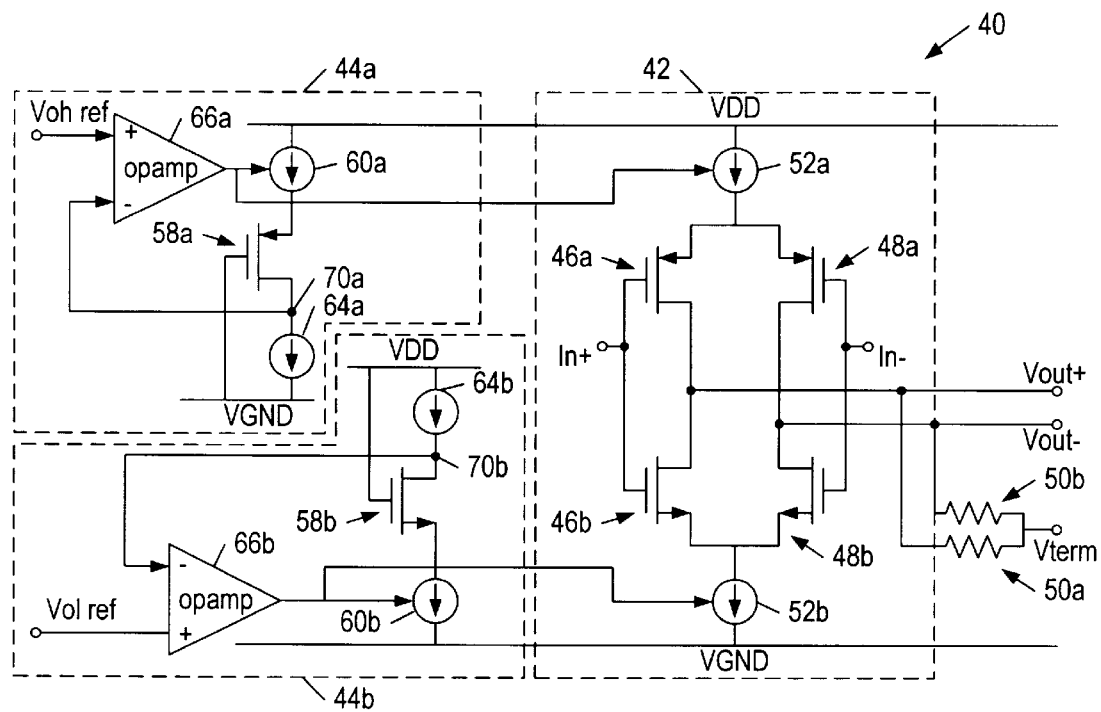
FIG. 4 is an electrical diagram in schematic form of a pseudo-ECL driver circuit using features of one embodiment of the present invention.

Referring to FIG. 4, a present embodiment output driver circuit 40 is shown. 4=-Circuit 40 provides output voltage recognizable to ECL circuits. The output levels are preferably those used by pseudo-ECL circuits, but also can be scaled to be used as a TTL output, a programming output, an ECL output, and MOS or CMOS output, etc.

Circuit 40 preferably comprises an open looped circuit 42 and a closed loop circuit 44. A pair of differential inputs In+ and In− may be connected to gate terminals of transistor pairs 46 and 48, respectively employed within open loop circuit 42. Transistor pairs 46a and 46b are shown as e.g., p-channel and n-channel transistors respectively. Similarly, transistor pairs 48a and 48b can be formed as p-channel and n-channel transistors, respectively. The p-channel transistors 46a and 48a may be sized as a multiple N of gate width W1 and gate length L1, wherein W1 and L1 are the gate width and length of transistor 58a. The n-channel transistors 46b and 48b may be sized as a multiple N of gate width W2 and gate length L2, wherein W2 and L2 are the gate width and length of transistor 58b. It is understood that the actual width and length values for each transistor can change provided, however, the ratio of W1/L1 remains dissimilar from W2/L2. The drain terminals of transistors 46a and 46b are preferably connected to the output terminal of driver circuit 40 and, either on the same substrate or off substrate, to the reference terminal voltage via resistor 50a. Conversely, the drain terminals of transistors 48a and 48b are connected to another output terminal of circuit 40 and to the reference terminal voltage via resistor 50b.

Transistors 46 and 48 are coupled between a pair of current sources 52a and 52b. Current source 52a delivers a multiple N of current I1, while current source 52b delivers a multiple current N of current I2. The current N(I1) delivered by source 52a is preferably the same amount of current delivered by current source 52b whenever the appropriate switching transistors or driver transistors, 46a through 48b are on. According to one example, current N(I1) and current N(I2) is within the range of approximately 6.0 milliamps to 10.0 milliamps. The differential output nodes Vout+ and Vout− may be biased through resistors 50a and 50b, respectively, from the reference terminal voltage Vterm. Open loop circuit 42 provides two current-mode driver stages 46a, 46b, 48a and 48b, to steer either a positive or negative current to Vterm, thus generating positive or negative output levels (Vout+ and Vout−).

The choice of output level on Vout+ and Vout− may be controlled by input switching signals at the gate conductors of the driver transistors 46a through 48b. The input switching signals are denoted as In+ and In−. Closing switch 46a and opening the switch 46b produces a logic high value upon Vout+(i.e., some voltage above Vterm). Conversely, closing switch 46b and opening switch 48a produces a logic low value upon Vout+(i.e., some voltage below Vterm). The same principles which affect Vout+ also affect Vout−. Opening and closing switches 48a and 48b cause change in logic levels of Vout−. Because the drivers are essentially open-loop designs, they are capable of high speed operation (i.e., at least 10 KHz to about 10 MHz or greater, more preferably at least 25 KHz and most preferably from 25 kHz to about 320 MHz).

A control over the output levels at Vout+ and Vout− may be provided by using one or more replica circuits within the closed loop circuits 44a and 44b. The replica circuits replicate current sources 52 and 54 and/or driver transistors 46a/48a and 46b/48b. Replica circuits include device which can be the same size as or smaller than the items they replicate. Preferably, replica transistor 58a is a p-channel transistor which is smaller than the p-channel transistors 46a and 48a. Similarly, replica transistor 48b is preferably an n-channel transistor which is smaller than n-channel transistor 46b and 48b. If scaled down, both die area and power dissipation may be reduced. In one example, the width and/or length of replica transistors 58 are scaled to 1/N, i.e., the output driver transistors 46 and 48 are N times larger in W1/L1 ratio than transistors 58, and the currents I1 and I2 are likewise N times larger than current delivered through primary current sources 60a and 60b.

The replica circuit items therefore comprise current source 60a conducting current I1 instead of, e.g., N(I1) of source 52a, along with replica transistor 58a which may be a p-channel device like transistors 46a and 48a but having a width-to-length ratio of W1/L1 instead of, e.g., N(W1/L1). The source/drain path of replica transistor 58a may be connected to ground through a current source 64a which provides a current of Ix. An opamp 66a may be configured to directly control the current level of current sources 60a and 52a. The inputs of the opamp 66a may comprise a relatively high reference voltage (e.g., Voh ref) and a feedback path from current source 64a as output of replica transistor 58a. When replica transistor 58a comprises a p-channel transistor, the gate of that transistor is connected to ground line to ensure the p-channel transistor will always be "on".

In a similar manner, replica devices of closed loop circuit 44b employs a primary current source 60b conducting current I2 along with a replica transistor 58b. Replica transistor 58b may be an n-channel device like transistors 46b and 48b, but possibly having a size W2/L2 instead of, e.g., N(W2/L2). The source/drain path of replica transistor 58b is connected to the VDD supply line through a current source 64b which conducts a current of Ix. Accordingly, current through source 64b matches the current through source 64a during times when respective sources 60b and 60a are active. Opamp 66b has an output connected to control the current level of current sources 64a and 64b with the inputs of opamp 66b being a relatively low reference voltage (e.g., Vol ref). Opamp 66b also includes a feedback path from the output of replica transistor 58b. The gate of replica transistor 58b is connected to the power supply VDD so that if replica transistor 58b is an n-channel transistor, it always be "on".

The various current sources shown in FIG. 4 may be n-channel or p-channel MOS transistors depending on whether a logic high or low value is output from opamps 66. The sourced current is therefore dependent on the size of the n- and p-channel transistors being used, as well as the voltage magnitude forwarded from the opamp. The current and/or voltage output from closed loop circuits 44a and 44b may be such that the current sources (e.g., the p- and n-channel transistors of sources 52a and 52b, respectively) respond with a desired current value (e.g., N(I1) and N(I2)).

Figure 6A:
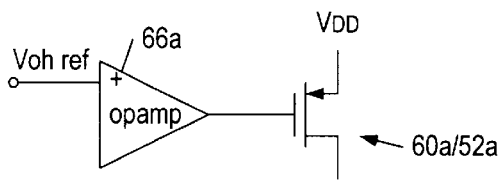
FIGS. 6a and 6b are circuit schematics of switchable current sources shown in FIG. 4, according to one embodiment.
Figure 6B:
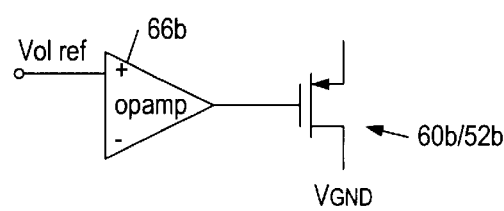

Referring to FIGS. 4, 6a and 6b, reference is made to current sources 60a and 60b as being, for example, p-channel and n-channel transistors respectively. FIG. 6a illustrates current source 60a and current source 52a embodied as p-channel transistors. The size of those transistors (i.e., the width/length ratio) dictates the amount of current I1 or N(I1) being delivered. FIG. 6b illustrates current sources 60b and 52b embodied as n-channel transistors, according to one embodiment. The n-channel transistors deliver current I1 and N(I1) based on the size of the n-channel devices.

Replica transistors 58a and 58b may be permanently "on" (i.e., placed in a low resistance state) to replicate the output driver transistors 46 and 48 when those transistors are on. On the high voltage side of circuit 40 (i.e., those elements located between a driver transistor/replica transistor and VDD), desired operation provides a current level, which may be adjusted by the feedback loop to equal Ix. Current Ix is placed through replica transistor 58 and maintained at a regulated value when the replica output level at node 70a is at Voh-ref (the desired ECL output logic high level). Current Ix may be set to a level such that a current NIx passing through output resistor 50a generates the desired voltage level at Vout+. Reference voltage Vterm and resistor 50a may be present to change the voltage level Vout+ from, e.g., CMOS levels to ECL levels. Operational amplifier 66a and closed-loop feedback circuit 44a may compare the output level of the feedback loop with the desired output (e.g., Voh-ref) which is generated from a bandgap reference, and the voltage difference is used to appropriately adjust I1. The resulting corrected current I1 is input to the output drivers by and/or through a current mirror (e.g., current source N(I)), resulting in a logic high value at the output Vout+ of circuit 40 when switch 46a is closed.

In similar manner, on the low side, desired operation is obtained when the current I2 through the source 60b has been adjusted by the feedback loop to equal Ix when the replica output level is at Vol ref, the desired output logic low level. The current Ix is set to the appropriate level such that NIx passing through the output resistor 50b generates the desired voltage levels at the Vout-. Opamp 66b and closed-loop feedback is used to compare the actual low output level generated at the node 70b with the desired output low level Vol-ref on line 43, and the difference is used to appropriately adjust I2. The resulting corrected current I2 is mirrored to the output drivers using a current mirror possibly scaled by N. This results in a proper logic low value at the driver output Vout- when the lower switch 48b is closed.

The circuit described in reference to numeral 40, according to features of the invention, produces relatively precise control of the output levels displayed on Vout+ and Vout-, while enabling high speed operation. The output voltage control is obtained through a closed-loop feedback design embodied within replica circuits 44a and 44b. The closed loop arrangement regulates Ix and quickly mirrors that current through the appropriate switching transistor (i.e., driver transistor) of driver circuit 42. Thus, the replica devices produce a closely controlled current which is quickly available in scaled form (i.e., replicated) through driver circuit 42 and into resistors 50. Settling time used to eventually produce the regulated current is of no consequence since that current is pre-regulated before switching, and therefore quickly available in a regulated state to the driver circuit. Accordingly, the driver circuit merely channels the regulated current in a high speed environment attributed to an open loop design. In contrast to existing feedback-based designs, the bandwidth of the closed-loop system does not limit the driver circuit switching speed.

Figure 7A:
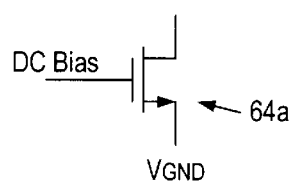
FIGS. 7a and 7b are circuit schematics of constant biased current sources shown in FIG. 4, according to one embodiment.
Figure 7B:
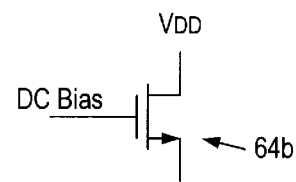

The regulated current within the closed loop circuits 44 is maintained at a relatively constant value after settling has occurred. That constant value is partially the result of a constant DC bias voltage applied to current sources 64. Referring to FIGS. 4, 7a and 7b, current sources 64a and 64b are shown as n-channel and p-channel transistors, respectively, according to one embodiment. The DC bias voltage is chosen to ensure the corresponding n-channel and p-channel transistors are always in a low resistance state between the source and drain junctions.

Scale factor N representing the scale factor difference between replica devices and the driver devices, can be set at any positive real constant. Preferably, however, N is an integer greater than or equal to two, more preferably greater than or equal to 10, most preferably from 1 to 10. Also, the scale factor of secondary current source 52a and thus the p-channel driver transistors 46a and 48a can differ from that of the other secondary current source 52b and thus the n-channel driver transistors 46b and 48b.

Figure 5:
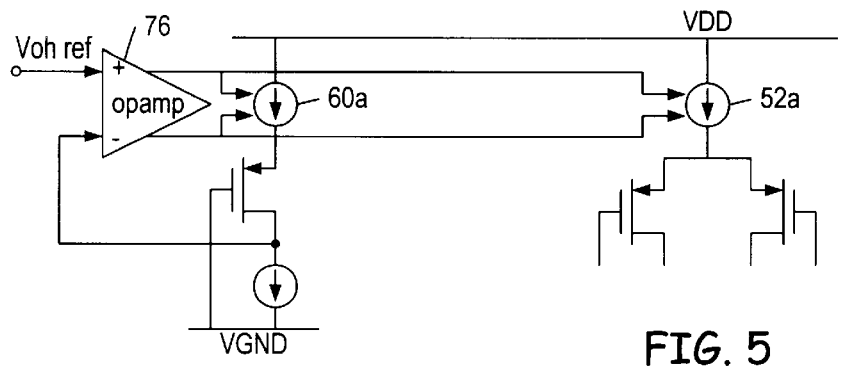
FIG. 5 is an electrical diagram in schematic form of a portion of the output driver circuit shown in FIG. 4 modified to employ fully differential opamps according to an alternative embodiment of FIG. 4.

In another embodiment of the invention, as seen in FIG. 5, a fully differential opamp 76 can be used in lieu of opamp 66 (i.e., opamp 66a and 66b). Opamp 76 includes differential outputs which differentially control currents within current sources 60a and 52a. Opamp 76 can likewise be used in lieu of opamp 66b in order to complete the lower closed loop circuit 44b in differential form.

Figure 8A:
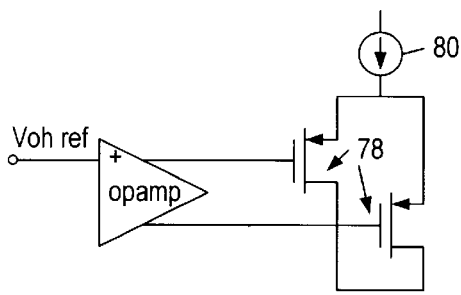
Figure 8A:
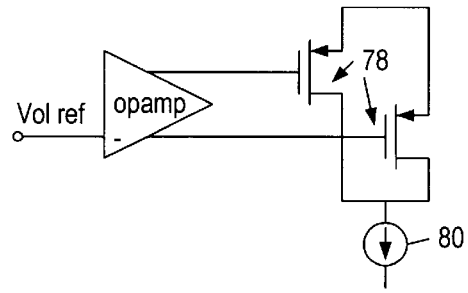

Referring to FIGS. 5, 8a and 8b in combination, differential control of current sources 60 and 52 takes place by configuring a pair of p-channel or n-channel transistors 78 to control a current source 80. Current source 80 may be modulated, for example, by a constant DC bias voltage.

Circuit 40, shown in FIG. 4, and its derivative shown in FIG. 5, has been described as being useful for pseudo-ECL or PECL devices, but is not restrictive to only PECL devices. Devices using other technologies such as CMOS or TTL or other desired output levels (such as for programming a conventional PROM, EPROM or $E^2$PROM) may advantageously use the feature herein described).

Resistor 50 may be coupled to Vout+ or Vout- either internal to the chip on which circuit is embodied, or external to that chip. An on-chip resistor may provide a constant output voltage across all temperatures and fabrication process variations.

While the invention has been particularly shown and described with reference to a preferred embodiment, it will be understood by those skilled in the art that various changes in form and detail may be made therein without departing from the spirit and scope of the invention.

What is claimed is:

1. A driver circuit, comprising:
   a closed loop circuit having an input and an output, wherein the output is operably fed back to the input for regulating current within a current path;
   a constant-biased transistor within the current path, wherein the constant-biased transistor is connected between a replicated current source and a non-replicated current source; and
   an open loop circuit configured to replicate said regulated current by replicating said replicated current source and forward the replicated current through a resistor coupled between an output terminal of the driver circuit and a node coupled to receive a pre-determined reference terminal voltage.

2. The driver circuit as recited in claim 1, wherein said replicated current is forwarded through a driver transistor having a drain terminal of the driver transistor coupled to the output terminal.

3. The driver circuit as recited in claim 2, wherein said replicated current is presented to said driver transistor prior to times in which said driver transistor is switched to a low resistance state.

4. The driver circuit as recited in claim 2, wherein said driver transistor is coupled in series between a current source and the output terminal.

5. The driver circuit as recited in claim 1, wherein the non-replicated current source comprises a transistor.

6. The driver circuit as recited in claim 5, wherein the non-replicated current source is connected between the constant-biased transistor and a power supply or ground.

7. A driver circuit, comprising:
   an operational amplifier coupled to produce a regulated current through a node to which an input of the operational amplifier is connected via feedback;
   a driver transistor having an output node coupled through a resistor to a reference terminal voltage; and
   wherein said driver transistor is configured to produce an output voltage upon said output node substantially equal to the reference terminal voltage offset by a voltage produced by forwarding through the resistor a current scaled as a multiple of the regulated current.

8. The driver circuit as recited in claim 7, wherein said multiple of the regulated current is equal to one.

9. The driver circuit as recited in claim 7, wherein said multiple of the regulated current is greater than one.

10. The driver circuit as recited in claim 7, wherein said output voltage is equal to the reference terminal voltage minus the voltage produced by the scaled current forwarded through the resistor.

11. The driver circuit as recited in claim 7, wherein said output voltage is equal to the reference terminal voltage plus the voltage produced by the scaled current forwarded through the resistor.

12. The driver circuit as recited in claim 7, wherein said node is adapted to receive a regulated voltage substantially equal to a reference level voltage applied to an input of the operational amplifier, and wherein said reference level voltage upon said node is substantially replicated upon the output node of said driver transistor during times when the driver transistor is switched to a low resistance state.

13. The driver circuit as recited in claim 12, wherein said driver transistor further includes an input node coupled to receive a switching input signal whose magnitude is periodically altered to switch the driver transistor to a low resistance state.

14. The driver circuit as recited in claim 12, wherein said reference level voltage is available to be placed upon the output node prior to times when the driver transistor is switched to a low resistance state.

15. The driver circuit as recited in claim 7, wherein said output node of the driver transistor comprises an output of said driver circuit.

16. The driver circuit as recited in claim 15, further comprising:
   a first current source and a second current source, both of which are modulated by an output from said operational amplifier;
   a replica transistor coupled between said first current source and said node; and
   said driver transistor is coupled between said second current source and the output of said driver circuit, wherein the current through said first current source and the replica transistor comprises the regulated current, and wherein the current through the second current source and the driver transistor is replicated from and scaled a multiple of the regulated current during times when the driver transistor is switched to a low resistance state.

17. The driver circuit as recited in claim 15, further comprising:
   a first current source and a second current source, both of which are modulated by an output from said operational amplifier;
   a replica transistor coupled between said first current source and said node; and
   said driver transistor is coupled between said second current source and the output of said driver circuit, wherein a voltage drop across said first current source and the replica transistor is replicated and substantially equal to a voltage drop across the second current source and the driver transistor during times when the driver transistor is switched to a low resistance state.

18. A method for producing a regulated output voltage, comprising:
   generating a substantially fixed current through a current path operably modulated by an output of a closed loop circuit, wherein a source/drain path of a constant biased transistor is located within a feedback loop of said closed loop circuit; and
   replicating the fixed current and forwarding the replicated current through a resistor coupled between an output node of an open loop circuit and a reference terminal voltage to produce said regulated output voltage upon said output node.

19. The method as recited in claim 18, wherein said generating comprises maintaining, at a terminal of the constant biased transistor, a voltage equal to a reference level voltage applied to an input of the closed loop circuit.

20. The method as recited in claim 18, wherein said generating comprises maintaining, across the constant biased transistor, a voltage equal to a power supply voltage minus a sum of a reference level voltage and a current source voltage, and wherein the reference level voltage is applied to an input of the closed loop circuit.

21. The method as recited in claim 18, wherein said replicating comprising mirroring the substantially fixed current through a driver transistor during times when the driver transistor is switched to a low resistance state.

22. The method as recited in claim 21, wherein said reference terminal voltage is substantially fixed, and wherein said replicated current forwarded through the resistor ensures a substantially constant output voltage upon the output node during times when the driver transistor is switched to a low resistance state.

* * * * *